US010156589B2

(12) United States Patent
Hebiguchi

(10) Patent No.: US 10,156,589 B2
(45) Date of Patent: Dec. 18, 2018

(54) SENSOR MODULE THAT SWITCHES PLURAL SENSORS CAPABLE OF MEASURING DIFFERENT RANGES TO EXTEND DYNAMIC RANGE

(71) Applicant: Alps Electric Co., Ltd., Ota-ku, Tokyo (JP)

(72) Inventor: Hiroyuki Hebiguchi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 215 days.

(21) Appl. No.: 15/389,869

(22) Filed: Dec. 23, 2016

(65) Prior Publication Data

US 2017/0108536 A1    Apr. 20, 2017

Related U.S. Application Data

(63) Continuation of application No. PCT/JP2015/071812, filed on Jul. 31, 2015.

(30) Foreign Application Priority Data

Aug. 5, 2014    (JP) .................................. 2014-159849

(51) Int. Cl.
   *G01R 19/00*    (2006.01)
   *G01R 15/20*    (2006.01)
   (Continued)

(52) U.S. Cl.
   CPC ............. *G01R 15/08* (2013.01); *G01R 15/09* (2013.01); *G01R 19/0092* (2013.01); *G01R 15/207* (2013.01)

(58) Field of Classification Search
   CPC .. G01R 19/0092; G01R 15/202; G01R 15/20; G01R 15/205; G01R 19/10
   See application file for complete search history.

(56) References Cited

U.S. PATENT DOCUMENTS 7,164,263 B2 *   1/2007   Yakymyshyn ....... G01R 15/207
                                                324/117 H
7,471,080 B2 * 12/2008   Sasaki ................ G01D 5/24428
                                                324/174
(Continued)

FOREIGN PATENT DOCUMENTS

JP    H08-194016    7/1996
JP    2004-132790    4/2004
(Continued)

OTHER PUBLICATIONS

International Search Report dated Oct. 20, 2015 from International Application No. PCT/JP2015/071812.

*Primary Examiner* — Alesa Allgood
(74) *Attorney, Agent, or Firm* — Beyer Law Group LLP

(57) ABSTRACT

An output of a first sensor having a low sensitivity and an output of the second sensor having a high sensitivity are compared with each other, and thus it is determined whether a physical quantity becomes larger than a maximum value of a physical quantity capable of being measured in the second sensor. A sensor module is provided which is configured to switch a plurality of sensors capable of measuring different ranges and to extend a dynamic range by selecting the output of the second sensor in a selection unit in a case where the output of the first sensor and the output of the second sensor are coincident with each other, and selecting the output of the first sensor in the selection unit in a case where the output of the first sensor and the output of the second sensor are not coincident with each other.

9 Claims, 12 Drawing Sheets

(51) Int. Cl.
*G01R 15/14* (2006.01)
*G01R 19/10* (2006.01)
*G01R 15/08* (2006.01)
*G01R 15/09* (2006.01)

(56) References Cited

U.S. PATENT DOCUMENTS

| | | | | |
|---|---|---|---|---|
| 7,821,253 | B2 * | 10/2010 | Serpinet | G01R 15/207 |
| | | | | 324/117 R |
| 2008/0157705 | A1 * | 7/2008 | Sasaki | G01D 5/24428 |
| | | | | 318/564 |
| 2010/0001716 | A1 * | 1/2010 | Serpinet | G01R 15/207 |
| | | | | 324/117 R |
| 2013/0293224 | A1 * | 11/2013 | Kotera | G01R 19/0092 |
| | | | | 324/252 |
| 2015/0042325 | A1 * | 2/2015 | Snoeij | G01R 15/185 |
| | | | | 324/251 |

FOREIGN PATENT DOCUMENTS

| | | |
|---|---|---|
| JP | 2007-078417 | 3/2007 |
| WO | 2012/053296 | 4/2012 |

* cited by examiner

FIG. 3A
FIG. 3B
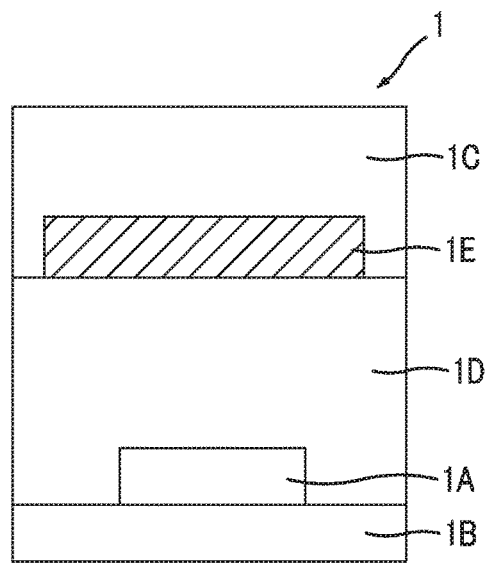
FIRST MAGNETIC SENSOR
(LARGE CURRENT SIDE,
LOW SENSITIVITY)
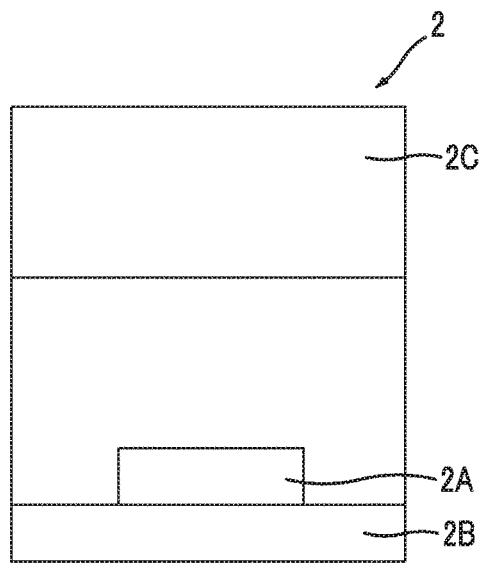
SECOND MAGNETIC SENSOR
(SMALL CURRENT SIDE, HIGH
SENSITIVITY)

SENSOR MODULE THAT SWITCHES PLURAL SENSORS CAPABLE OF MEASURING DIFFERENT RANGES TO EXTEND DYNAMIC RANGE

CLAIM OF PRIORITY

This application is a Continuation of International Application No. PCT/JP2015/071812 filed Jul. 31, 2015, which claims priority to Japanese Patent Application No. 2014-159849 filed on Aug. 5, 2014, which are hereby incorporated by reference.

BACKGROUND OF THE INVENTION

1. Field of the Invention

The present invention relates to a sensor module that switches a plurality of sensors capable of measuring different ranges to extend a dynamic range, and particularly relates to a technique suitable for a current sensor module using a plurality of magnetic sensors capable of measuring different magnitudes of magnetic fields.

2. Description of the Related Art

As a method of extending the range of measurement of a sensor, a method of switching sensors capable of detecting different magnitudes of physical quantities is generally known. In a sensitivity switching-type sensor circuit disclosed in U.S. Pat. No. 7,382,150 B2 described below, the voltages of shunt resistors are amplified in an amplifier for a small current of a high gain and an amplifier for a large current of a low gain, respectively. After a low-frequency component is extracted by a low-pass filter, the output signals of the respective amplifiers are converted into pieces of detection data x and y which are digital values in an A/D converter, and are loaded into a microcomputer. In the microcomputer, a current value is calculated on the basis of the detection data x in a case where the detection data x of the amplifier for a small current is smaller than a threshold iL, and a current value is calculated on the basis of the data y in a case where the detection data y of the amplifier for a large current is larger than a threshold iH (>iL).

SUMMARY OF THE INVENTION

In U.S. Pat. No. 7,382,150 B2, the shunt resistor is used as a current detection element, but the same circuit can be realized even in a case where a magnetic sensor such as a magneto-electric conversion element or a current transformer is used. The magnetic sensor is often used in, particularly, the intended use in which it is required to insulate a measuring system from a system to be measured, for example, in a high-voltage circuit of an electric automobile, a hybrid automobile or the like.

Even in cases of sensors that measure any physical quantities (such as, for example, magnetism, current, voltage, power, electrical resistance, temperature, acceleration, velocity, illuminance, volume level, pressure, temperature, humidity, malodor, the sense of taste, vibration, length, liquid level, and flow rate), most of the sensors are of limited measurable range. For example, since the magnetic sensor contains a magnetic material, and the magnetic material generates magnetic saturation when receiving a high magnetic field due to a large current, an error occurs in a detection result. FIG. 12 is a diagram illustrating the characteristics of a magnetic current sensor. The horizontal axis represents a current I, and the vertical axis represents an output signal Sout of the magnetic sensor. In an example of FIG. 12, when a current exceeding a current value Is flows, the sensitivity of the magnetic sensor decreases due to magnetic saturation, the linearity of the output signal Sout with respect to the current I deteriorates. Normally, magnetic saturation is generated at a smaller current as sensitivity (output signal level/current) increases, and thus it is preferable that a low-sensitivity magnetic sensor is used for a large current, and that a high-sensitivity magnetic sensor is used for a small current.

Therefore, in a case where the same circuit as that in U.S. Pat. No. 7,382,150 B2 is realized by the magnetic sensor, a system is considered in which, with a low-sensitivity magnetic sensor and a high-sensitivity magnetic sensor prepared, the high-sensitivity magnetic sensor is connected to the amplifier for a small current, and the low-sensitivity magnetic sensor is connected to the amplifier for a large current. Thereby, it is possible to further improve an S/N ratio or linearity in the range of measurement of a small current than in a system in which the amplifier for a large current and the amplifier for a small current are connected to the same magnetic sensor.

Incidentally, in a current sensor having a range of measurement for a large current using a low-sensitivity magnetic sensor and a range of measurement for a small current using a high-sensitivity magnetic sensor, the range of measurement for a small current has to be used in the range of a current in which the magnetic saturation of the high-sensitivity magnetic sensor is not generated. When the magnetic saturation is generated, the output level of the magnetic sensor decreases as described above, and thus an error is generated in the measurement result of a current. Therefore, in a case where switching of the range of measurement is automatically performed, it is necessary to determine whether magnetic saturation is generated in the high-sensitivity magnetic sensor.

An example of a method of determining the presence or absence of the magnetic saturation of a magnetic sensor includes a method of comparing an output of the magnetic sensor with a predetermined threshold. In such a method, in a case where the output of the magnetic sensor is smaller than a predetermined threshold in which distortion is not generated due to magnetic saturation, it is determined that magnetic saturation is not generated in the magnetic sensor.

However, an individual variation, temperature variation, a variation over time, or the like is present in the performance of the magnetic sensor. For this reason, in order to secure a margin for such a variation in performance, the threshold is required to be made to be lower than an actual maximum value at which the output of the magnetic sensor does not generate distortion due to magnetic saturation. In a case where a variation in performance is large, a margin has to be increased, and a threshold becomes much lower. When the threshold becomes lower, the range of measurement for a small current becomes smaller, and thus there is a problem of a decrease in the accuracy of measurement or a resolution at a small current.

The present invention provides a technique for switching a plurality of sensors capable of measuring different ranges to extend the range of measurement of a sensor having a high sensitivity in a sensor module that extends a dynamic range.

In order to solve the above-mentioned problems of the related art, according to the present invention, there is provided a sensor including a first sensor configured to measure a physical quantity; a second sensor configured to measure the physical quantity; a selection unit configured to select any one of an output of the first sensor and an output of the second sensor; and a comparison unit configured to compare a first measurement result indicated by the output of the first sensor with a second measurement result indicated by the output of the second sensor. The first sensor is larger in a maximum value of the physical quantity capable of being measured than the second sensor, and the second sensor is higher in sensitivity of measurement of the physical quantity than the first sensor. The comparison unit causes the selection unit to select the output of the second sensor in a case where the second measurement result and the first measurement result are coincident with each other within a predetermined range, and outputs a first control signal for causing the selection unit to select the output of the first sensor in a case where the second measurement result and the first measurement result are not coincident with each other within the predetermined range.

According to the above configuration, in a case where the physical quantity is smaller than the maximum value of the physical quantity capable of being measured in the second sensor, the physical quantity can be measured both the first sensor and the second sensor. In this case, the first measurement result indicated by the output of the first sensor and the second measurement result indicated by the output of the second sensor become substantially equal to each other. Thereby, since the second measurement result and the first measurement result are coincident with each other within the predetermined range, the output of the second sensor is selected in the selection unit on the basis of the first control signal which is output from the comparison unit.

On the other hand, in a case where the physical quantity becomes larger than the maximum value of the physical quantity capable of being measured in the second sensor, distortion is generated in the output of the second sensor, and a level difference occurs between the first measurement result and the second measurement result. In a case where a difference between the measurement results becomes larger as the second measurement result and the first measurement result are not coincident with each other within the predetermined range, the output of the first sensor is selected in the selection unit on the basis of the first control signal which is output from the comparison unit.

In this manner, in the current sensor, it is determined whether the physical quantity becomes larger than maximum value of the physical quantity capable of being measured in the second sensor on the basis of a relative comparison between the first measurement result and the second measurement result, the selection of a sensor in the selection unit is switched. Therefore, the range of measurement of a high-sensitivity sensor is further extended than in a method of determining whether distortion is generated in the output of the high-sensitivity sensor on the basis of a comparison between a fixed threshold having a margin and the measurement results.

Preferably, the comparison unit may output the first control signal for causing the selection unit to select the output of the second sensor in a case where a difference or a ratio between the first measurement result and the second measurement result is included in a predetermined range, and may output the first control signal for causing the selection unit to select the output of the first sensor in a case where the difference or the ratio falls outside the predetermined range.

According to the above configuration, it is determined whether the physical quantity becomes larger than the maximum value of the physical quantity capable of being measured in the second sensor, depending on whether the difference or the ratio between the first measurement result and the second measurement result is included in the predetermined range, and the selection in the control unit is controlled.

Preferably, the sensor module may further include: a first low-pass filter through which the output of the first sensor selected in the selection unit passes; and a second low-pass filter through which the output of the second sensor selected in the selection unit passes. The comparison unit may compare the first measurement result which is indicated by the output of the first sensor having passed through the first low-pass filter with the second measurement result which is indicated by the output of the second sensor having passed through the second low-pass filter.

According to the above configuration, it is determined whether the physical quantity becomes larger than the maximum value of the physical quantity capable of being measured in the second sensor, on the basis of a relative comparison between the first measurement result indicated by the output of the first sensor having passed through the first low-pass filter and the second measurement result indicated by the output of the second sensor having passed through the second low-pass filter.

Preferably, the sensor module may further include: a first low-pass filter through which the output of the first sensor selected in the selection unit passes; a second low-pass filter through which the output of the second sensor selected in the selection unit passes; and an off-delay timer configured to output a second control signal based on the first control signal to the selection unit. The comparison unit may compare the first measurement result of the current to be measured which is indicated by the output of the first sensor before passing through the first low-pass filter with the second measurement result of the current to be measured which is indicated by the output of the second sensor before passing through the second low-pass filter. The off-delay timer may immediately output the second control signal for causing the selection unit to select the output of the first sensor in a case where the first control signal is input which indicates that the difference or the ratio between the first measurement result and the second measurement result falls outside the predetermined range, and may output the second control signal for causing the selection unit to select the output of the second sensor in a case where the first control signal indicating that the difference or the ratio between the first measurement result and the second measurement result falls within the predetermined range continues to be input for a certain period of time.

According to the above configuration, in a case where a difference or a ratio between the first measurement result indicated by the output of the first sensor before passing through the first low-pass filter and the second measurement result indicated by the output of the second sensor before passing through the second low-pass filter falls outside a predetermined range, the output of the first sensor is immediately selected in the selection unit. Therefore, even in a case where the physical quantity rapidly increases, the output of the second sensor is not likely to be selected by the selection unit in a state where the current to be measured exceeds the maximum value.

In addition, in a case where a state in which the difference or the ratio between the first measurement result and the second measurement result is within the predetermined range continues for a certain period of time, the output of the second sensor is selected in the selection unit. Therefore, while the influence of the output of the second sensor in a state where the physical quantity exceeds the maximum value remains in the second low-pass filter, the output of the first sensor is selected in the selection unit, and the output of the second sensor is selected in the selection unit after the influence is reduced.

Preferably, the comparison unit may include an amplification unit configured to amplify an output signal of the first sensor, and a coincidence determination unit configured to determine whether a difference between the output signal of the first sensor amplified in the amplification unit and an output signal of the second sensor is within a predetermined range. In this case, the amplification unit may have an amplification factor which is set so that a signal obtained by amplifying the output signal of the first sensor and the output signal of the second sensor become equal to each other in a case where the physical quantity is smaller than a maximum value of the physical quantity in a magnetic field capable of being measured in the second sensor.

According to the above configuration, in a case where the physical quantity is smaller than the maximum value of the physical quantity capable of being measured in the second sensor, the output signal of the first sensor and the output signal of the second sensor which are amplified by the amplification unit become substantially equal to each other, and it is determined in the coincidence determination unit that a difference between these signals is within the predetermined range.

On the other hand, in a case where the physical quantity becomes larger than the maximum value of the physical quantity capable of being measured in the second sensor, and distortion is generated in the output of the second sensor, a difference occurs between the output signal of the first sensor and the output signal of the second sensor which are amplified by the amplification unit. In a case where the current to be measured becomes further larger and the distortion of the output of the second sensor increases, it is determined in the coincidence determination unit that the difference falls outside the predetermined range.

Preferably, the amplification unit may amplify the output signal of the first sensor which is input to the selection unit.

Thereby, even in a case where either of the output from the first sensor or the output from the second sensor is selected in the selection unit, the ratios of signals which are output from the selection unit to the current to be measured become the same as each other.

Preferably, the sensor module may further include: a first analog-digital conversion circuit configured to convert the output signal of the first sensor into a digital signal; a second analog-digital conversion circuit configured to convert the output signal of the second sensor into a digital signal; and a digital signal processing circuit configured to input the digital signal of the first analog-digital conversion circuit and the digital signal of the second analog-digital conversion circuit. The digital signal processing circuit may include the comparison unit and the selection unit.

Preferably, the sensor module may further include a failure detection unit configured to determine whether the physical quantity is smaller than a physical quantity having a predetermined threshold which is smaller than the maximum value of the physical quantity capable of being measured in the second sensor on the basis of an output signal of the first sensor, an output signal of the second sensor, or an output signal of the selection unit, and to output a signal indicating detection of a failure in a case where the first control signal indicating that the difference or the ratio between the first measurement result and the second measurement result falls outside the predetermined range is output from the comparison unit when the current to be measured is smaller than the physical quantity having the threshold.

According to the above configuration, in a case where the physical quantity is smaller than a physical quantity having the threshold, the physical quantity becomes smaller than the maximum value of the physical quantity capable of being measured in the second sensor. In this case, in a normal state having no failure, the difference and the ratio between the first measurement result and the second measurement result become substantially equal to each other. Therefore, in the comparison unit, it is determined that the second measurement result and the first measurement result are coincident with each other within a predetermined range. On the other hand, in a case where the physical quantity is smaller than the physical quantity having the threshold, a signal indicating the detection of a failure is output in the failure detection unit when it is determined in the comparison unit that the difference or the ratio falls outside the predetermined range.

Preferably, the first sensor may be a first magnetic sensor configured to be capable of measuring magnetism which is generated depending on a current to be measured, the second sensor may be a second magnetic sensor configured to be capable of measuring magnetism generated depending on the current to be measured, the output of the first magnetic sensor may indicate a first current level obtained by the first magnetic sensor measuring the current to be measured, the output of the second magnetic sensor may indicate a second current level obtained by the second magnetic sensor measuring the current to be measured, and a signal which is output by the sensor module may be a signal indicating a magnitude of the current to be measured.

According to the above configuration, even in a case where a magnetic sensor (for example, magneto-electric conversion element such as a GMR or a Hall element) of a type in which an output is distorted is used when large magnetism is received, it is possible to extend the dynamic range of the current sensor.

According to the present invention, in a sensor module that switches a plurality of sensors capable of measuring different ranges to extend a dynamic range, it is possible to extend the range of measurement of a sensor having a high sensitivity. Particularly, in a current sensor of a type in which an induction magnetic field is measured, it is possible to extend the range of measurement.

BRIEF DESCRIPTION OF THE DRAWINGS

FIGS. 3A and 3B are diagrams illustrating an example of a configuration of a magnetic sensor which is used in a current sensor; FIG. 3A shows a configuration example of a first magnetic sensor for a large current, and FIG. 3B shows a configuration example of a second magnetic sensor for a small current.

FIG. 11A shows an example in which a signal of the magnetic sensor having passed through a low-pass filter is input to the failure detection unit, and FIGS. 11B and 11C show examples in which a signal of the magnetic sensor having passed through the low-pass filter and an amplification unit is input to the failure detection unit.

DESCRIPTION OF THE PREFERRED EMBODIMENTS

Hereinafter, sensors according to embodiments of the present invention will be described.

First Embodiment

Figure 1:
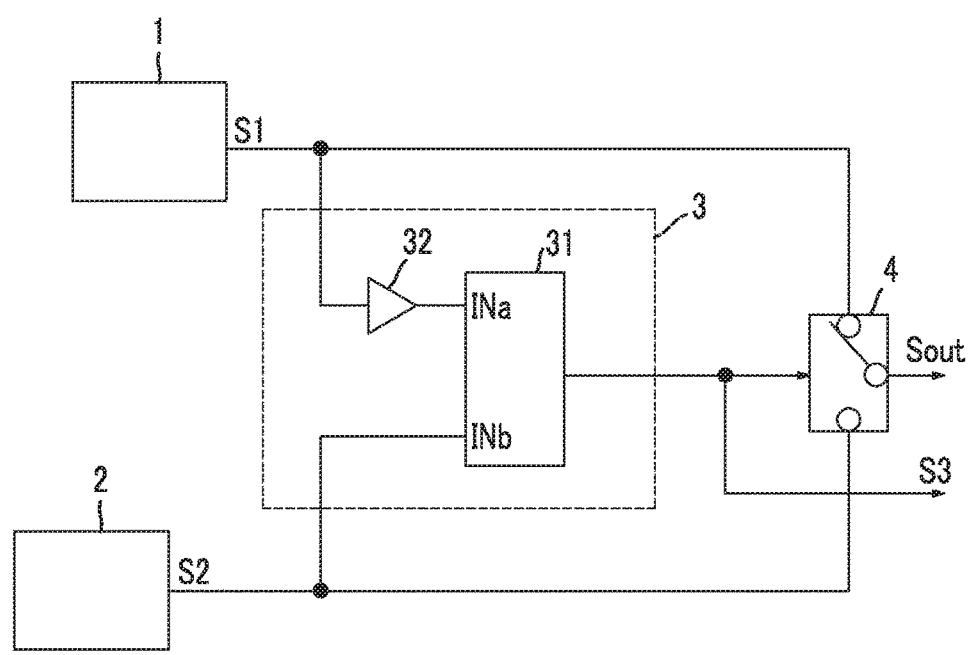
FIG. 1 is a diagram illustrating an example of a configuration of a sensor according to a first embodiment.

FIG. 1 is a diagram illustrating an example of a configuration of a sensor module according to a first embodiment of the present invention. This sensor module is a sensor module that measures a physical quantity through sensors (1 and 2), and switches between and uses two sensors (1 and 2) different from each other in sensitivity to a physical quantity in accordance with the range of measurement. Examples of physical quantities to be measured include magnetism, current, voltage, power, electrical resistance, temperature, acceleration, velocity, illuminance, volume level, pressure, humidity, malodor, the sense of taste, vibration, length, liquid level, and flow rate. Particularly, the details of a current sensor module using a magnetic sensor will be described later. In FIG. 1, configurations and operations which are applicable to even cases where any physical quantities are measured will be described.

The current sensor module shown in FIG. 1 includes a first sensor 1 and a second sensor 2 that measure a physical quantity, a comparison unit 3 that compares measurement results indicated by respective outputs of the first sensor 1 and the second sensor 2, and a selection unit 4 that selects any one of an output S1 of the first sensor 1 and an output S2 of the second sensor 2 in accordance with a first control signal S3 which is output by the comparison unit 3.

First Sensor 1 and Second Sensor 2

The first sensor 1 and the second sensor 2 are sensors that measure some kind of physical quantity. The first sensor 1 is larger in the maximum value of a measurable physical quantity than the second sensor 2. In addition, the second sensor 2 is higher in the sensitivity of measurement of a physical quantity than the first sensor 1.

Comparison Unit 3

The comparison unit 3 compares a result (first measurement result) obtained by measuring a physical quantity indicated by the output of the first sensor 1 with a result (second measurement result) obtained by measuring a physical quantity indicated by the output of the second sensor 2, and controls the selection unit 4 in accordance with the comparison result. That is, the comparison unit 3 causes the selection unit 4 to select the output of the second sensor 2 in a case where the second measurement result and the first measurement result are coincident with each other within a predetermined range, and outputs the first control signal S3 for causing the selection unit 4 to select the output of the first sensor 1 to the selection unit 4 in a case where the second measurement result and the first measurement result are not coincident with each other within the predetermined range.

For example, the comparison unit 3 outputs the first control signal S3 for causing the selection unit 4 to select the output of the second sensor 2 in a case where a difference or a ratio between the first measurement result and the second measurement result is included in the predetermined range, and outputs the first control signal S3 for causing the selection unit 4 to select the output of the first sensor 1 in a case where the difference or the ratio falls outside the predetermined range.

In the example of FIG. 1, the comparison unit 3 includes a coincidence determination unit 31 and an amplification unit 32.

The amplification unit 32 amplifies an output signal of the first sensor 1. In a case where the amplification unit 32 has a physical quantity smaller than the maximum value of a physical quantity capable of being measured in the second sensor 2, the amplification unit has an amplification factor which is set so that a signal obtained by amplifying the output signal of the first sensor 1 and an output signal of the second sensor 2 become equal to each other.

The coincidence determination unit 31 inputs the output signal of the first sensor 1 amplified in the amplification unit 32 and the output signal of the second sensor 2, and determines whether a difference between the two input signals is within a predetermined range. In a case where the difference between the two input signals is within the predetermined range, the coincidence determination unit 31 outputs the first control signal S3 for causing the selection unit 4 to select the output of the second sensor 2. In a case where the difference between the two input signals falls outside the predetermined range, the coincidence determination unit 31 outputs the first control signal S3 for causing the selection unit 4 to select the first sensor 1.

Figure 4:
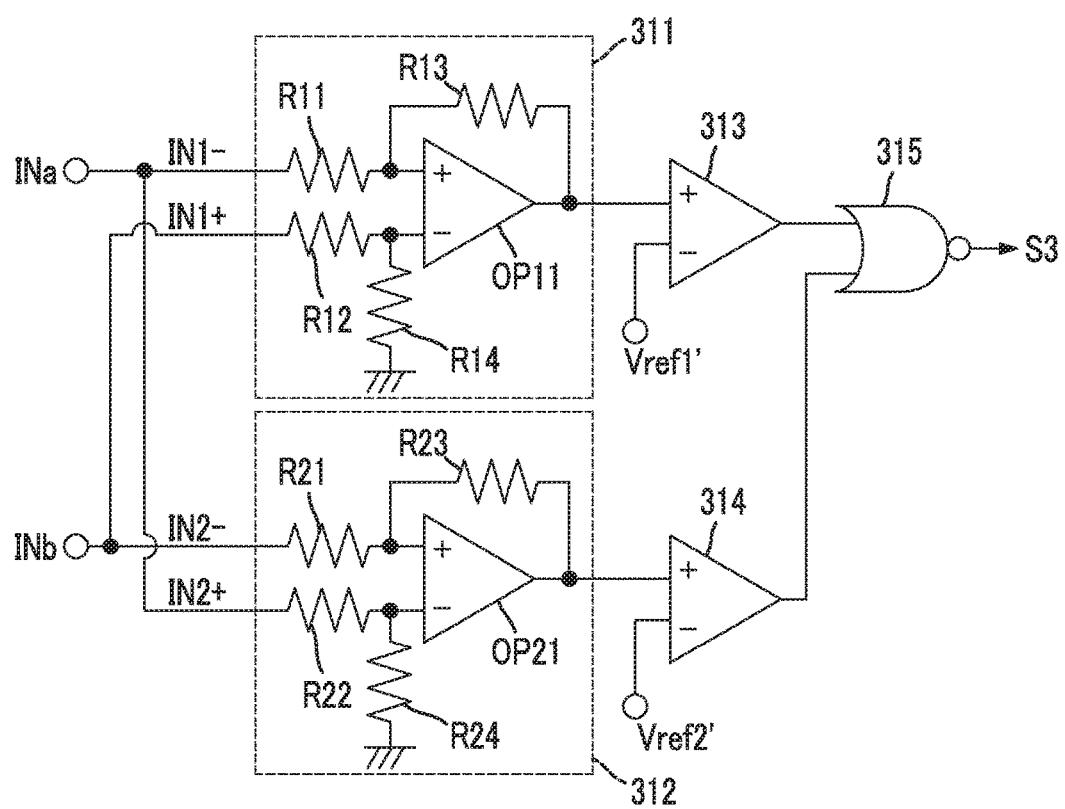
FIG. 4 is a diagram illustrating an example of a configuration of a coincidence determination circuit.

FIG. 4 is a diagram illustrating an example of a configuration of the coincidence determination circuit 31.

The coincidence determination unit 31 shown in FIG. 4 includes a first differential amplifier 311, a second differential amplifier 312, a first comparator 313, a second comparator 314, and a logic gate 315.

The first differential amplifier 311 amplifies a level difference between a non-inverting input terminal IN1+ and an inverting input terminal IN1−. The output terminal of the amplification unit 32 is connected to the inverting input terminal IN1− of the first differential amplifier 311, and the output terminal of the second magnetic sensor 2 is connected to the non-inverting input terminal IN1+ of the first differential amplifier 311.

The first differential amplifier 311 includes an operational amplifier OP11 and resistors R11 to R14, for example, as shown in FIG. 4. The non-inverting input terminal of the operational amplifier OP11 is connected to the inverting input terminal IN1− through the resistor R11, and is connected to the output terminal of the operational amplifier OP11 through the resistor R13. The inverting input terminal of the operational amplifier OP11 is connected to the non-inverting input terminal IN1+ through the resistor R12, and is connected to the ground through the resistor R14.

The second differential amplifier 312 amplifies a level difference between a non-inverting input terminal IN2+ and an inverting input terminal IN2−. The output terminal of the second magnetic sensor 2 is connected to the inverting input terminal IN2− of the second differential amplifier 312, and the output terminal of the amplification unit 32 is connected to the non-inverting input terminal IN2+ of the second differential amplifier 312.

The second differential amplifier 312 includes an operational amplifier OP21 and resistors R21 to R24, for example, as shown in FIG. 4. The non-inverting input terminal of the operational amplifier OP21 is connected to the inverting input terminal IN2− through the resistor R21, and is connected to the output terminal of the operational amplifier OP21 through the resistor R23. The inverting input terminal of the operational amplifier OP21 is connected to the non-inverting input terminal IN2+ through the resistor R22, and is connected to the ground through the resistor R24.

The first comparator 313 compares the output level of the first differential amplifier 311 with a first threshold Vref1'.

The second comparator 314 compares the output level of the second differential amplifier 312 with a second threshold Vref2'.

The logic gate 315 arithmetically operates a negative logical sum of an output of the first comparator 313 and an output of the second comparator 314.

In a case where the output level of the second sensor 2 becomes higher than the output level of the amplification unit 32, and a difference between the output levels becomes larger, the output level of the first differential amplifier 311 rises. In a case where the difference between the output levels exceeds a predetermined level difference, the output level of the first differential amplifier 311 becomes higher than the first threshold Vref1', a signal of a high level is output from the first comparator 313, and an output signal S3 of the logic gate 315 is set to be at a low level.

In addition, in a case where the output level of the amplification unit 32 becomes higher than the output level of the second sensor 2, and a difference between the output levels becomes larger, the output level of the second differential amplifier 312 rises. In a case where the difference between the output levels exceeds a predetermined level difference, the output level of the second differential amplifier 312 becomes higher than the second threshold Vref2', a signal of a high level is output from the second comparator 314, and the output signal S3 of the logic gate 315 is set to be at a low level.

In this manner, the output signal S3 of the logic gate 315 is set to be at a low level where level difference between the output level of the second sensor 2 and the output level of the amplification unit 32 becomes larger than a predetermined level difference. On the other hand, the output signal S3 of the logic gate 315 is set to be at a high level where the level difference between the output level of the second sensor 2 and the output level of the amplification unit 32 becomes smaller than the predetermined level difference.

Meanwhile, in the example of FIG. 4, the logic gate 315 is provided which arithmetically operates a negative logical sum of the output of the first comparator 313 and the output of the second comparator 314, but the logic gate 315 may be provided which arithmetically operates a logical sum instead of the negative logical sum. In addition, in a circuit where a hysteresis comparator having a predetermined hysteresis width is connected to the subsequent stage of a differential amplifier having a differential output, the same operation as that of the coincidence determination unit 31 shown in FIG. 4 can also be realized.

The above is the description of the coincidence determination unit 31.

Selection Unit 4

The selection unit 4 selects the output of the second sensor 2 to allow passage of the output in a case where the first control signal S3 (first control signal S3 of a high level in the example of FIG. 4) indicating that the second measurement result and the first measurement result are coincident with each other within a predetermined range is output from the comparison unit 3. On the other hand, the selection unit 4 selects the output of the first sensor 1 to allow passage of the output in a case where the first control signal S3 (first control signal S3 of a low level in the example of FIG. 4) indicating that the second measurement result and the first measurement result fall outside the predetermined range is output from the comparison unit 3. The selection unit 4 is constituted by, for example, a single pole dual throw (SPDT) switch.

The operation of the sensor module having the above-described configuration will be described.

In a case where a physical quantity is small to a degree of being able to be measured in the second sensor 2, the output of the second sensor 2 is not distorted, and thus the measurement result (first measurement result) of a physical quantity indicated by the output of the first sensor 1 and the measurement result (second measurement result) of a physical quantity indicated by the output of the second sensor 2 become substantially equal to each other. In this case, two input signals (the signal obtained by amplifying the output signal of the first sensor 1 and the output signal of the second sensor 2) of the coincidence determination unit 31 become substantially equal to each other. The coincidence determination unit 31 outputs the first control signal S3 (first control signal S3 of a high level in the example of FIG. 4) indicating that a difference between the two input signals is within a predetermined range to the selection unit 4. The selection unit 4 having received the first control signal S3 selects the output of the second sensor 2.

Therefore, in a case where a physical quantity is small to a degree of being able to be measured in the second sensor 2 (in a case where the output of the second sensor 2 is not distorted), the selection unit 4 selects the output of the second sensor 2 having a high sensitivity.

On the other hand, in a case where a physical quantity becomes larger than the maximum value of a physical quantity capable of being measured in the second sensor 2, the output of the second sensor 2 is distorted. For this reason, a difference occurs between the measurement result (first measurement result) of a physical quantity indicated by the output of the first sensor 1 and the measurement result (second measurement result) of a physical quantity indicated by the output of the second sensor 2. In this case, a difference also occurs between the two input signals (the signal obtained by amplifying the output signal of the first sensor 1 and the output signal of the second sensor 2) of the coincidence determination unit 31. In a case where a physical quantity becomes larger, the distortion of the output of the second sensor 2 becomes larger, and the difference between the two input signals of the coincidence determination unit 31 also becomes larger. In a case where the difference between the two input signals falls outsides a predetermined range, the coincidence determination unit 31 outputs the first control signal S3 (first control signal S3 of a low level in the example of FIG. 4) indicating the fact to the selection unit 4. The selection unit 4 having received the first control signal S3 selects the output of the first sensor 1.

Therefore, in a case where a physical quantity becomes larger than the maximum value of a physical quantity capable of being measured in the second sensor 2, the selection unit 4 selects the output of the first sensor 1 having a low sensitivity.

In a subsequent-stage circuit which is not shown, the rate of conversion in a process of converting a signal Sout output from the selection unit 4 into a physical quantity is switched in accordance with the first control signal S3.

For example, in a case where the sensitivity of the first sensor 1 is assumed to be set to be ⅓ of the sensitivity of the second sensor 2, in the subsequent-stage circuit, the output signal Sout (or, data after AD conversion is performed on the output signal) in a case where the output from the first sensor 1 is selected in the selection unit 4 is multiplied by a threefold gain. Thereby, a difference in the output signal Sout due to a difference in sensitivity between the first sensor 1 and the second sensor 2 is corrected. In such a process, the first control signal S3 is used as a signal indicating the selection state of the selection unit 4.

As described above, according to the sensor module of the present embodiment, the output of the first sensor 1 having a low sensitivity and the output of the second sensor 2 having a high sensitivity are compared with each other, and thus it is determined whether a physical quantity becomes larger than the maximum value of a physical quantity capable of being measured in the second sensor 2. The output of the second sensor 2 is selected in the selection unit 4 in a case where a physical quantity is smaller than the maximum value, and the output of the first sensor 1 is selected in the selection unit 4 in a case where a physical quantity exceeds the maximum value.

That is, the measurable range of a physical quantity in the second sensor 2 having a high sensitivity is determined on the basis of a relative comparison between the measurement results (first measurement result and second measurement result) of a physical quantity indicated by two sensors having different sensitivities, and the range of measurement is switched.

In a method of comparing a fixed threshold with an output of a sensor, an individual variation, a temperature variation, a variation over time, or the like in the performance of the sensor is present, and thus it is necessary to excessively narrow the range of measurement of the second sensor 2. On the other hand, in the sensor module according to the present embodiment, it can be accurately determined whether the output of the second sensor 2 is distorted or is not distorted during the measurement operation of the sensor. That is, hitherto, the distortion of a sensor output has been able to be measured only before factory shipment. For this reason, hitherto, the presence or absence of distortion has been presumed using a threshold. On the other hand, in the present invention, it is possible to detect the presence or absence of the distortion of the second sensor 2 having a high sensitivity during the measurement operation of the sensor. Therefore, it is possible to extend the range of measurement of the second sensor 2 having a high sensitivity.

Hereinafter, a description will be given of an example in which the sensor according to the embodiment of the present invention is applied to a current sensor.

Configuration having Sensor of First Embodiment Applied to Current Sensor

Figure 2:
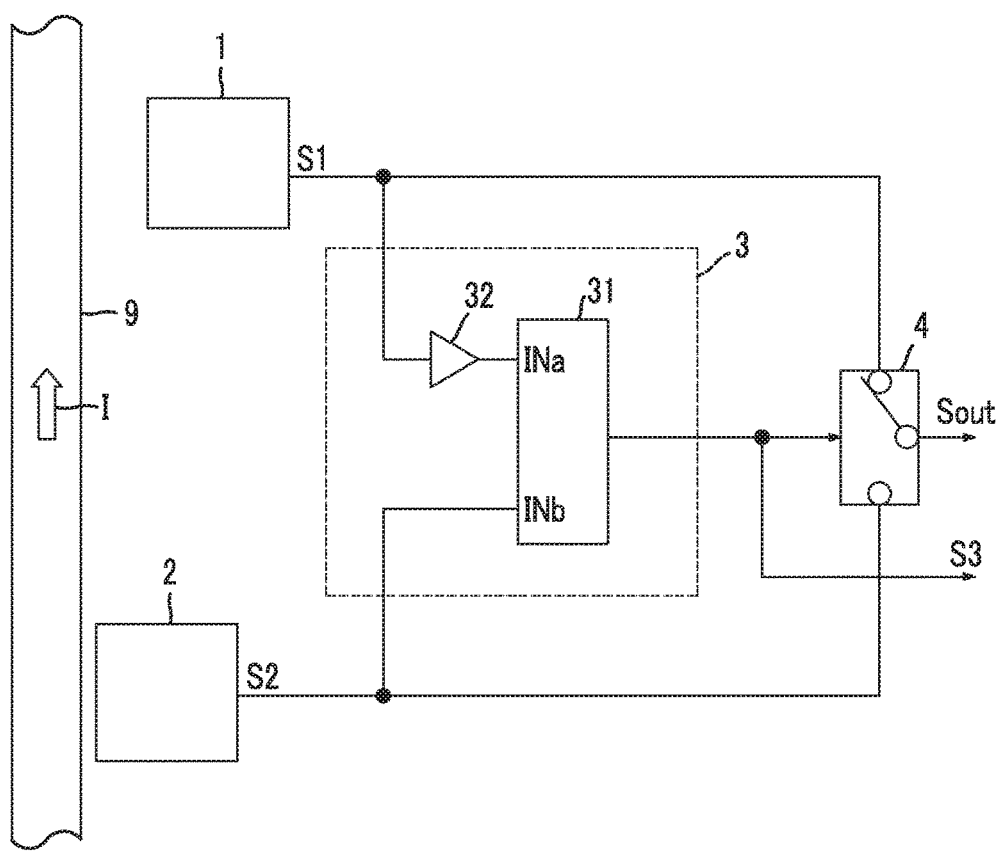
FIG. 2 is a diagram illustrating an example of a configuration in which the sensor of the first embodiment is applied to a current sensor.

FIG. 2 is a diagram illustrating an example of a configuration of the sensor module according to the first embodiment of the present invention. In this example, the sensor module is a current sensor module. This current sensor module is a magnetic current sensor module that measures a magnetic field generated depending on a current I to be measured which flows to a current path 9, using the magnetic sensors (1 and 2), and switches between and uses two magnetic sensors (1 and 2) different from each other in sensitivity to the current I in accordance with the range of measurement.

The current sensor module shown in FIG. 2 includes the first magnetic sensor 1 and the second magnetic sensor 2 that measures a magnetic field generated depending on the current I to be measured, the comparison unit 3 that compares current levels of the current I to be measured which are indicated by respective outputs of the first magnetic sensor 1 and the second magnetic sensor 2, and the selection unit 4 that selects any one of the output S1 of the first magnetic sensor 1 and the output S2 of the second magnetic sensor 2 in accordance with the first control signal S3 which is output by the comparison unit 3.

First Magnetic Sensor 1 and Second Magnetic Sensor 2

The first magnetic sensor 1 and the second magnetic sensor 2 are sensors that measure a magnetic field generated depending on the current I to be measured which flows to the current path 9, and are configured to include any of various sensor elements, such as, for example, a Hall element, a magneto-resistive effect element (such as a GMR element or a TMR), or a current transformer, which convert a magnetic field into an electrical signal. The first magnetic sensor 1 is larger in the maximum value of the current I to be measured in a magnetic field capable of being measured (for example, maximum value of the current I to be measured under conditions in which magnetic saturation is not generated due to the magnetic field of the current I to be measured) than the second magnetic sensor 2. In addition, the second magnetic sensor 2 is higher in the sensitivity of measurement of a magnetic field generated depending on the current I to be measured than the first magnetic sensor 1.

In the present embodiment, as shown in, for example, FIG. 2, a distance from the current path 9 to the second magnetic sensor 2 is shorter than a distance from the current path 9 to the first magnetic sensor 1. That is, the second magnetic sensor 2 is disposed at a position where a magnetic field due to the current I to be measured is larger that of the first magnetic sensor 1. In addition, the first magnetic sensor 1 and the second magnetic sensor 2 are elements having the same characteristics.

The second magnetic sensor 2 is located at a position where a magnetic field due to the current I to be measured is larger than that of the first magnetic sensor 1. Therefore, even in a case where the second magnetic sensor has the same characteristics as those of the first magnetic sensor 1, the second magnetic sensor becomes higher in measurement sensitivity to the current I to be measured than the first magnetic sensor 1, and becomes smaller in the current value of the current I to be measured at which magnetic saturation starts to be generated than the first magnetic sensor 1.

The first magnetic sensor 1 and the second magnetic sensor 2 are configured to be elements having the same characteristics, and thus it is possible to reduce the number of types of components.

Meanwhile, in another example of the present embodiment, the first magnetic sensor 1 and the second magnetic sensor 2 may not be elements having the same characteristics. For example, FIGS. 3A and 3B are examples of two magnetic sensors having different sensitivities. FIG. 3A shows a configuration example of the first magnetic sensor 1, and FIG. 3B shows a configuration example of the second magnetic sensor 2. The first magnetic sensor 1 shown in FIG. 3A is configured such that a magnetic shield 1E is provided on a magneto-resistive effect element 1A disposed on a substrate 1B with an insulating layer 1D interposed therebetween, and that an insulating layer 1C is formed on the magnetic shield 1E. On the other hand, the second magnetic sensor 2 shown in FIG. 3B is configured such that an insulating layer 2C is formed on a magneto-resistive effect element 2A disposed on a substrate 2B, but a magnetic shield is not provided. The first magnetic sensor 1 having the magnetic shield 1E is relatively low in sensitivity to a magnetic field, and the second magnetic sensor 2 not having a magnetic shield is relatively high in sensitivity to a magnetic field. In a case where there is such a difference in sensitivity, the distance from the current path 9 to the first magnetic sensor 1 and the distance from the current path 9 to the second magnetic sensor 2 may be the same as each other.

The second magnetic sensor 2 is higher in sensitivity to the same magnetic field intensity than the first magnetic sensor 1. Therefore, even in a case where the distance from the current path 9 is the same as that of the first magnetic sensor 1, the measurement sensitivity to the current I to be measured becomes higher than that of the first magnetic sensor 1, and the current value of the current I to be measured at which magnetic saturation starts to be generated becomes smaller than that of the first magnetic sensor 1.

The distance from the current path 9 to the first magnetic sensor 1 and the distance from the current path 9 to the second magnetic sensor 2 are made to be the same as each other, and thus it is possible to reduce the size of a device.

In addition, the sensitivities of the first magnetic sensor 1 and the second magnetic sensor 2 to the magnetic field of the current I to be measured can also be made to be different from each other by changing the angle of a sensitivity axis with respect to the direction of the magnetic field of the current path 9.

Comparison Unit 3

The comparison unit 3 compares a current level (first current level) of the current I to be measured which is indicated by the output of the first magnetic sensor 1 with a current level (second current level) of the current I to be measured which is indicated by the output of the second magnetic sensor 2, and controls the selection unit 4 in accordance with the comparison result. That is, the comparison unit 3 causes the selection unit 4 to select the output of the second magnetic sensor 2 in a case where the second current level and the first current level are coincident with each other within a predetermined range, and outputs the first control signal S3 for causing the selection unit 4 to select the output of the first magnetic sensor 1 to the selection unit 4 in a case where the second current level and the first current level are not coincident with each other within the predetermined range.

For example, the comparison unit 3 outputs the first control signal S3 for causing the selection unit 4 to select the output of the second magnetic sensor 2 in a case where a difference or a ratio between the first current level and the second current level is included in a predetermined range, and outputs the first control signal S3 for causing the selection unit 4 to select the output of the first magnetic sensor 1 in a case where the difference or the ratio falls outside the predetermined range.

In the example of FIG. 2, the comparison unit 3 includes the coincidence determination unit 31 and the amplification unit 32.

The amplification unit 32 amplifies an output signal of the first magnetic sensor 1. In a case where the current I to be measured is smaller than the maximum value of the current I to be measured in a magnetic field capable of being measured in the second magnetic sensor 2, the amplification unit 32 has an amplification factor which is set so that a signal obtained by amplifying the output signal of the first magnetic sensor 1 and an output signal of the second magnetic sensor 2 become equal to each other.

The coincidence determination unit 31 inputs the output signal of the first magnetic sensor 1 amplified in the amplification unit 32 and the output signal of the second magnetic sensor 2, and determines whether a difference between the two input signals is within a predetermined range. In a case where the difference between the two input signals is within the predetermined range, the coincidence determination unit 31 outputs the first control signal S3 for causing the selection unit 4 to select the output of the second magnetic sensor 2. In a case where the difference between the two input signals falls outside the predetermined range, the coincidence determination unit 31 outputs the first control signal S3 for causing the selection unit 4 to select the first magnetic sensor 1.

FIG. 4 is a diagram illustrating an example of a configuration of the coincidence determination circuit 31.

The coincidence determination unit 31 shown in FIG. 4 includes a first differential amplifier 311, a second differential amplifier 312, a first comparator 313, a second comparator 314, and a logic gate 315.

The first differential amplifier 311 amplifies a level difference between a non-inverting input terminal IN1+ and an inverting input terminal IN1−. The output terminal of the amplification unit 32 is connected to the inverting input terminal IN1− of the first differential amplifier 311, and the output terminal of the second magnetic sensor 2 is connected to the non-inverting input terminal IN1+ of the first differential amplifier 311.

The first differential amplifier 311 includes an operational amplifier OP11 and resistors R11 to R14, for example, as shown in FIG. 4. The non-inverting input terminal of the operational amplifier OP11 is connected to the inverting input terminal IN1− through the resistor R11, and is connected to the output terminal of the operational amplifier OP11 through the resistor R13. The inverting input terminal of the operational amplifier OP11 is connected to the non-inverting input terminal IN1+ through the resistor R12, and is connected to the ground through the resistor R14.

The second differential amplifier 312 amplifies a level difference between a non-inverting input terminal IN2+ and an inverting input terminal IN2−. The output terminal of the second magnetic sensor 2 is connected to the inverting input terminal IN2− of the second differential amplifier 312, and the output terminal of the amplification unit 32 is connected to the non-inverting input terminal IN2+ of the second differential amplifier 312.

The second differential amplifier 312 includes an operational amplifier OP21 and resistors R21 to R24, for example, as shown in FIG. 4. The non-inverting input terminal of the operational amplifier OP21 is connected to the inverting input terminal IN2− through the resistor R21, and is connected to the output terminal of the operational amplifier OP21 through the resistor R23. The inverting input terminal of the operational amplifier OP21 is connected to the non-inverting input terminal IN2+ through the resistor R22, and is connected to the ground through the resistor R24.

The first comparator 313 compares the output level of the first differential amplifier 311 with a first threshold Vref1'.

The second comparator 314 compares the output level of the second differential amplifier 312 with a second threshold Vref2'.

The logic gate 315 arithmetically operates a negative logical sum of an output of the first comparator 313 and an output of the second comparator 314.

In a case where the output level of the second magnetic sensor 2 becomes higher than the output level of the amplification unit 32, and a difference between the output levels becomes larger, the output level of the first differential amplifier 311 rises. In a case where the difference between the output levels exceeds a predetermined level difference, the output level of the first differential amplifier 311 becomes higher than the first threshold Vref1', a signal of a high level is output from the first comparator 313, and an output signal S3 of the logic gate 315 is set to be at a low level.

In addition, in a case where the output level of the amplification unit 32 becomes higher than the output level of the second magnetic sensor 2, and a difference between the output levels becomes larger, the output level of the second differential amplifier 312 rises. In a case where the difference between the output levels exceeds a predetermined level difference, the output level of the second differential amplifier 312 becomes higher than the second threshold Vref2', a signal of a high level is output from the second comparator 314, and the output signal S3 of the logic gate 315 is set to be at a low level.

In this manner, the output signal S3 of the logic gate 315 is set to be at a low level where level difference between the output level of the second magnetic sensor 2 and the output level of the amplification unit 32 becomes larger than a predetermined level difference. On the other hand, the output signal S3 of the logic gate 315 is set to be at a high level where the level difference between the output level of the second magnetic sensor 2 and the output level of the amplification unit 32 becomes smaller than the predetermined level difference.

Meanwhile, in the example of FIG. 4, the logic gate 315 is provided which arithmetically operates a negative logical sum of the output of the first comparator 313 and the output of the second comparator 314, but the logic gate 315 may be provided which arithmetically operates a logical sum instead of the negative logical sum. In addition, in a circuit where a hysteresis comparator having a predetermined hysteresis width is connected to the subsequent stage of a differential amplifier having a differential output, the same operation as that of the coincidence determination unit 31 shown in FIG. 4 can also be realized.

The above is the description of the coincidence determination unit 31.

Selection Unit 4

The selection unit 4 selects the output of the second magnetic sensor 2 to allow passage of the output in a case where the first control signal S3 (first control signal S3 of a high level in the example of FIG. 4) indicating that the second current level and the first current level are coincident with each other within a predetermined range is output from the comparison unit 3. On the other hand, the selection unit 4 selects the output of the first magnetic sensor 1 to allow passage of the output in a case where the first control signal S3 (first control signal S3 of a low level in the example of FIG. 4) indicating that the second current level and the first current level fall outside the predetermined range is output from the comparison unit 3. The selection unit 4 is constituted by, for example, a single pole dual throw (SPDT) switch.

The operation of the current sensor module having the above-described configuration will be described.

In a case where the current I to be measured is small to a degree of being able to measure a magnetic field in the second magnetic sensor 2, magnetic saturation or the like is not generated in the second magnetic sensor 2, and thus the current level (first current level) of the current I to be measured which is indicated by the output of the first magnetic sensor 1 and the current level (second current level) of the current I to be measured which is indicated by the output of the second magnetic sensor 2 become substantially equal to each other. In this case, two input signals (the signal obtained by amplifying the output signal of the first magnetic sensor 1 and the output signal of the second magnetic sensor 2) of the coincidence determination unit 31 become substantially equal to each other. The coincidence determination unit 31 outputs the first control signal S3 (first control signal S3 of a high level in the example of FIG. 4) indicating that a difference between the two input signals is within a predetermined range to the selection unit 4. The selection unit 4 having received the first control signal S3 selects the output of the second magnetic sensor 2.

Therefore, in a case where the current I to be measured is small to a degree of being able to measure a magnetic field in the second magnetic sensor 2 (in a case where the output of the second magnetic sensor 2 is not distorted due to the influence of magnetic saturation or the like), the selection unit 4 selects the output of the second magnetic sensor 2 having a high sensitivity.

On the other hand, in a case where the current I to be measured becomes larger than the maximum value of the current I to be measured in a magnetic field capable of being measured in the second magnetic sensor 2, magnetic saturation or the like is caused in the second magnetic sensor 2, and the output of the second magnetic sensor 2 is distorted. For this reason, a difference occurs between the current level (first current level) of the current I to be measured which is indicated by the output of the first magnetic sensor 1 and the current level (second current level) of the current I to be measured which is indicated by the output of the second magnetic sensor 2. In this case, a difference also occurs between the two input signals (the signal obtained by amplifying the output signal of the first magnetic sensor 1 and the output signal of the second magnetic sensor 2) of the coincidence determination unit 31. In a case where the current I to be measured becomes larger, the distortion of the output of the second magnetic sensor 2 becomes larger, and the difference between the two input signals of the coincidence determination unit 31 also becomes larger. In a case where the difference between the two input signals falls outsides a predetermined range, the coincidence determination unit 31 outputs the first control signal S3 (first control signal S3 of a low level in the example of FIG. 4) indicating the fact to the selection unit 4. The selection unit 4 having received the first control signal S3 selects the output of the first magnetic sensor 1.

Therefore, in a case where the current I to be measured becomes larger than the maximum value of the current I to be measured in a magnetic field capable of being measured in the second magnetic sensor 2, the selection unit 4 selects the output of the first magnetic sensor 1 having a low sensitivity.

In a subsequent-stage circuit which is not shown, the rate of conversion in a process of converting a signal Sout output from the selection unit 4 into the current value of the current I to be measured is switched in accordance with the first control signal S3.

For example, in a case where the sensitivity of the first magnetic sensor 1 is assumed to be set to be ⅓ of the sensitivity of the second magnetic sensor 2, in the subsequent-stage circuit, the output signal Sout (or, data after AD conversion is performed on the output signal) in a case where the output from the first magnetic sensor 1 is selected in the selection unit 4 is multiplied by a threefold gain. Thereby, a difference in the output signal Sout due to a difference in sensitivity between the first magnetic sensor 1 and the second magnetic sensor 2 is corrected. In such a process, the first control signal S3 is used as a signal indicating the selection state of the selection unit 4.

As described above, according to the current sensor module of the present embodiment, the output of the first magnetic sensor 1 having a low sensitivity and the output of the second magnetic sensor 2 having a high sensitivity are compared with each other, and thus it is determined whether the current I to be measured becomes larger than the maximum value of a magnetic field capable of being measured in the second magnetic sensor 2. The output of the second magnetic sensor 2 is selected in the selection unit 4 in a case where the current I to be measured is smaller than the maximum value, and the output of the first magnetic sensor 1 is selected in the selection unit 4 in a case where the current I to be measured exceeds the maximum value.

That is, the measurable range of the current I to be measured in the second magnetic sensor 2 having a high sensitivity is determined on the basis of a relative comparison between the current levels (first current level and second current level) of the current I to be measured which is indicated by two magnetic sensors having different sensitivities, and the range of measurement is switched.

In a method of comparing a fixed threshold with an output of a magnetic sensor, an individual variation, a temperature variation, a variation over time, or the like in the performance of the magnetic sensor is present, and thus it is necessary to excessively narrow the range of measurement of the second magnetic sensor 2. On the other hand, in the current sensor module according to the present embodiment, it can be accurately determined whether the current I to be measured becomes larger than the maximum value of a magnetic field capable of being measured in the second magnetic sensor 2, without being influenced by such a variation. Therefore, it is possible to extend the range of measurement of the second magnetic sensor 2 having a high sensitivity.

Second Embodiment

Next, a second embodiment of the present invention will be described.

Figure 5:
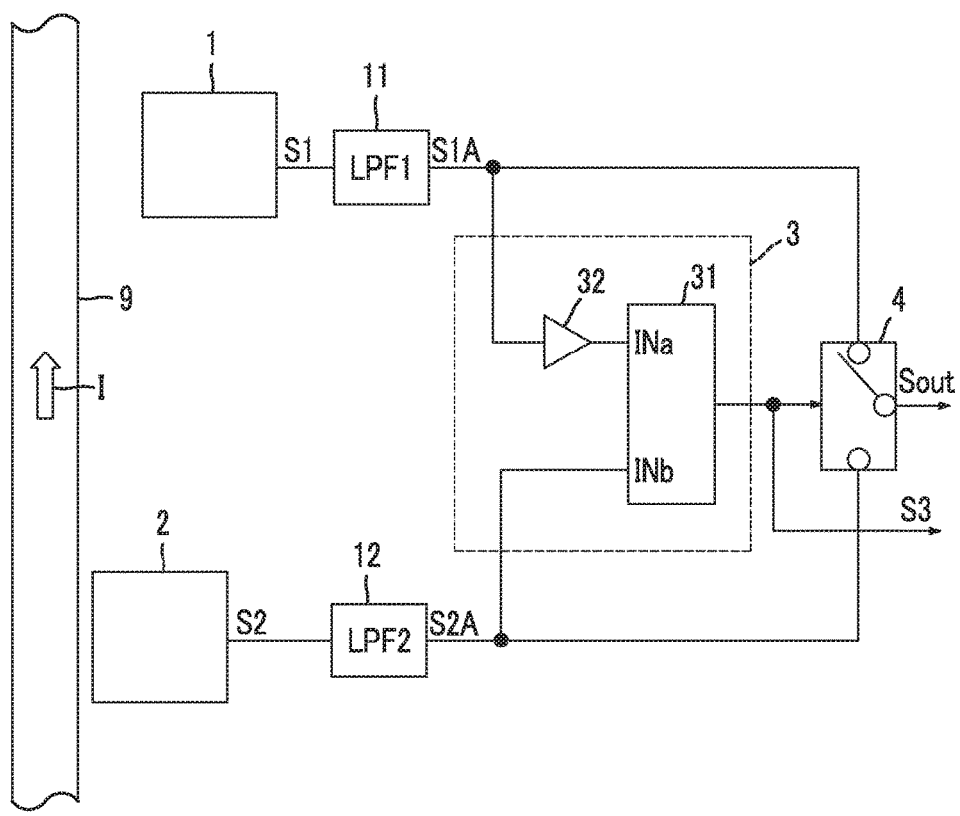
FIG. 5 is a diagram illustrating an example of a configuration of a current sensor according to a second embodiment.

FIG. 5 is a diagram illustrating an example of a configuration of a current sensor module according to the second embodiment. The current sensor module shown in FIG. 5 has the same configuration as that of the current sensor module shown in FIG. 2, and includes a first low-pass filter 11 and a second low-pass filter 12.

The first low-pass filter 11 attenuates a high frequency component such as noise included in the output of the first magnetic sensor 1. The output of the first magnetic sensor 1 passes through the first low-pass filter 11 and is input to the selection unit 4 and the comparison unit 3.

The second low-pass filter 12 attenuates a high frequency component such as noise included in the output of the second magnetic sensor 2. The output of the second magnetic sensor 2 passes through the second low-pass filter 12 and is input to the selection unit 4 and the comparison unit 3.

Each of the first low-pass filter 11 and the second low-pass filter 12 can be realized by any of an analog circuit and a digital circuit.

In the current sensor module shown in FIG. 5, the same operation as that of the current sensor module shown in FIG. 2 can also be performed, and the same effect can be exhibited. The output of the low-pass filter is influenced by its input applied a little while. For this reason, even when the output level of the low-pass filter is low, its correct magnitude is not output in a case where its input applied a little while before is distorted. In the present invention, distortion is not determined based on the magnitude of a signal, and the presence or absence of the distortion is determined by comparing the magnitude of an output of the first low-pass filter 11 with the magnitude of an output of the second low-pass filter 12. Thus, the distortion can be correctly determined regardless of the output level of the low-pass filter. In addition, since a signal which is input to the comparison unit 3 passes through the low-pass filters (11 and 12), a noise component included in the input signal of the comparison unit 3 is reduced, and a comparison operation can be stably performed. Further, since the frequency of the input signal of the comparison unit 3 becomes lower, and the comparison operation of the comparison unit 3 is performed at a low frequency, it is possible to improve the accuracy of the comparison operation.

Meanwhile, it is preferable that the first low-pass filter 11 and the second low-pass filter 12 have the same frequency characteristics. Thereby, since temporal changes in signals passing through these low-pass filters have a tendency to be coincident with each other, whether magnetic saturation is generated in the second magnetic sensor 2 can be more accurately determined in the comparison unit 3.

Third Embodiment

Next, a third embodiment of the present invention will be described.

FIG. 5 is a diagram illustrating an example of a configuration of a current sensor module according to the third embodiment. The current sensor module shown in FIG. 6 has the same configuration as that of the current sensor module shown in FIG. 2, and includes a first low-pass filter 11, the second low-pass filter 12, and an off-delay timer 5.

The first low-pass filter 11 and the second low-pass filter 12 are the same as the components denoted by the same reference numerals in the current sensor module shown in FIG. 5. However, the above current sensor module is different from the current sensor module shown in FIG. 5, in that the outputs of the first magnetic sensor 1 and the second magnetic sensor 2 are input to the comparison unit 3 without passing through these low-pass filters (11 and 12). That is, the comparison unit 3 compares the current level (first current level) of the current I to be measured which is indicated by the output of the first magnetic sensor 1 before passing through the first low-pass filter 11 with the current level (second current level) of the current I to be measured which is indicated by the output of the second magnetic sensor 2 before passing through the second low-pass filter 12.

The off-delay timer 5 outputs a second control signal S2, based on the first control signal S3 which is output from the comparison unit 3, to the selection unit 4, and controls the selection operation of the selection unit 4. In a case where the first control signal S3 (first control signal S3 of a low level in the example of FIG. 4) is input which indicates that a difference or a ratio between the first current level and the second current level falls outside a predetermined range, the off-delay timer 5 immediately outputs a second control signal S5 (second control signal S5 of a low level) for causing the selection unit 4 to select the output of the first magnetic sensor 1. On the other hand, in a case where the first control signal S3 (first control signal S3 of a high level in the example of FIG. 4) indicating that the difference or the ratio between the first current level and the second current level falls within the predetermined range continues to be input for a certain period of time, the off-delay timer 5 outputs the second control signal S5 (second control signal S5 of a high level) for causing the selection unit 4 to select the output of the second magnetic sensor 2. Meanwhile, the "certain period of time" is determined in accordance with the time constant of the second low-pass filter 12.

Figure 7:
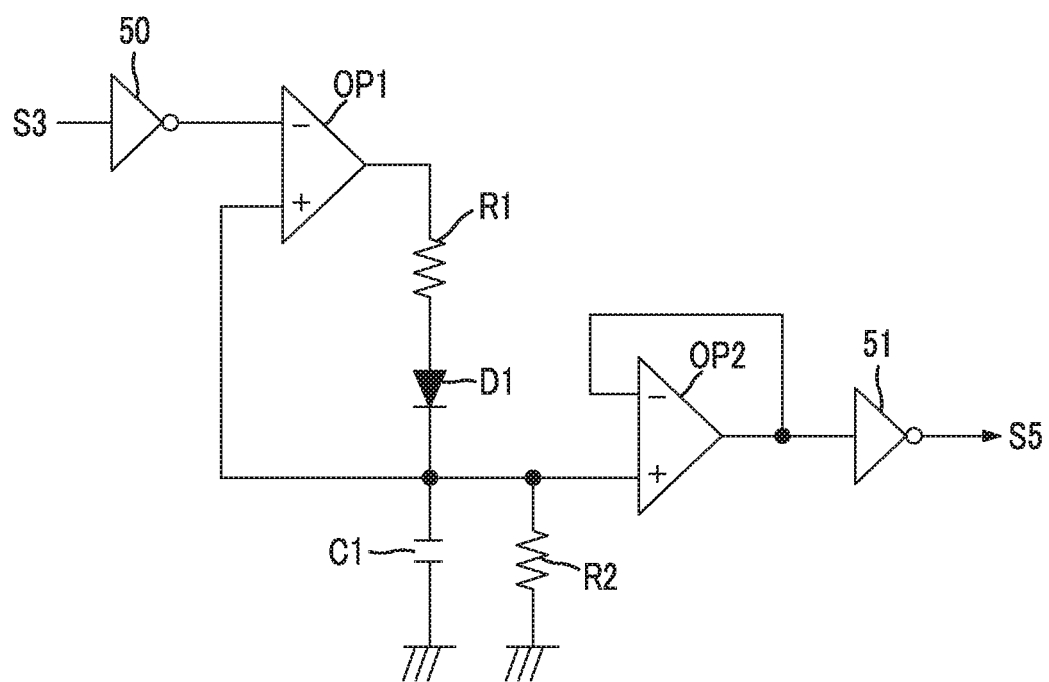
FIG. 7 is a diagram illustrating an example of a configuration of an off-delay timer.

FIG. 7 is a diagram illustrating an example of a configuration of the off-delay timer 5, and shows an example in which a pulse stretcher circuit is used.

In the example of FIG. 7, the off-delay timer 5 (pulse stretcher circuit) includes operational amplifiers OP1 and OP2, a diode D1, resistors R1 and R2, a capacitor C1, and inverter circuits 50 and 51. A signal obtained by inverting the first control signal S3 of the comparison unit 3 in the inverter circuit 50 is input to the non-inverting input terminal of the operational amplifier OP1. One terminal of the capacitor C1 is connected to the output of the operational amplifier OP1 through the resistor R1 and the diode D1, and is connected to the inverting input terminal of the operational amplifier OP1. The other terminal of the capacitor C1 is connected to the ground. The resistor R2 is connected in parallel to the capacitor C1. The non-inverting input terminal of the operational amplifier OP2 is connected to one terminal of the capacitor C1, and the inverting input terminal thereof is connected to the output of the operational amplifier OP2. The inverter circuit 51 is connected to the subsequent stage of the operational amplifier OP2. The second control signal S5 is output from the inverter circuit 51.

In a case where the first control signal S3 is set to be at a low level in a state where the voltage of the capacitor C1 is at a low level, and the output signal of the inverter circuit 50 is set to be at a high level, the output voltage of the operational amplifier OP1 rises, a current flows to the capacitor C1 through the resistor R1 and the diode D1, and the voltage of the capacitor C1 rises. In a case where the voltage of the capacitor C1 is set to be at the same high level as that of the output signal of the inverter circuit 50, a current flowing from the output of the operational amplifier OP1 to the capacitor C1 is set to zero, and a rise in the voltage of the capacitor C1 halts. In a case where the first control signal S3 is held at a low level, and the output signal of the inverter circuit 50 is held at a high level, the voltage of the capacitor C1 is also maintained at a high level. In a case where the voltage of the capacitor C1 is at a high level, the output of the operational amplifier OP2 is set to be at a high level, and thus the second control signal S5 which is output from the inverter circuit 51 is set to be at a low level.

In a case where the first control signal S3 is set to be at a high level in a state where the voltage of the capacitor C1 is at a high level, and the output signal of the inverter circuit 50 is set to be at a low level, the output voltage of the operational amplifier OP1 drops so as to discharge the capacitor C1. In this case, since a reverse voltage is applied to the diode D1, the diode D1 is set to be in an off-state. In a case where the diode D1 is turned off, the electrical charge of the capacitor C1 is slowly discharged by the resistor R2 without being rapidly discharged by the operational amplifier OP1. In this case, the voltage of the capacitor C1 drops at a fixed time constant according to the capacitance value of the capacitor C1 and the resistance value of the resistor R2.

The operational amplifier OP2 constitutes a buffer circuit of high input impedance and low output impedance, and inputs a signal having substantially the same level as that of the voltage of the capacitor C1 to the subsequent-stage inverter circuit 51. In a case where the voltage of the capacitor C1 drops from a high level at a fixed time constant, and the voltage becomes lower than the logical threshold of the inverter circuit 51, the output (that is, second control signal S5) of the inverter circuit 51 is reversed from a low level to a high level.

According to the off-delay timer 5 (pulse stretcher circuit) shown in FIG. 7, in a case where the first control signal S3 of the comparison unit 3 changes from a high level to a low level, a signal of a low level is output as the second control signal S5 immediately after the change. In a case where the first control signal S3 of the comparison unit 3 is maintained at a low level, a signal of a low level is output as the second control signal S5. In a case where the first control signal S3 of the comparison unit 3 changes from a low level to a high level, and the state of the high level continues for a certain period of time, the voltage of the capacitor C1 becomes lower than the logical threshold of the inverter circuit 51, and the second control signal S5 changes from a low level to a high level.

Meanwhile, the off-delay timer 5 can be realized by a circuit using, for example, a timer IC, in addition to the pulse stretcher circuit as shown in FIG. 7. In addition, the off-delay timer 5 may be constituted by an integrated circuit including a digital circuit or an analog circuit. Design is facilitated by using an existing integrated circuit.

The operation of the current sensor module shown in FIG. 6 having the above-described configuration will be described.

In a case where the current level (first current level) of the current I to be measured which is indicated by the output of the first magnetic sensor 1 and the current level (second current level) of the current I to be measured which is indicated by the output of the second magnetic sensor 2 are coincident with each other within a predetermined range (in a case where a difference between the output signal of the first magnetic sensor 1 and the output signal of the second magnetic sensor 2 which are amplified by the amplification unit 32 is within a predetermined range), the first control signal S3 of the comparison unit 3 is set to be at a high level, and the second control signal S5 of the off-delay timer 5 is also set to be at a high level. Therefore, in the selection unit 4, the output of the second magnetic sensor 2 having passed through the second low-pass filter 12 is selected, and is output as the output signal Sout.

On the other hand, in a case where the first current level and the second current level are not coincident with each other within the predetermined range (in a case where the difference between the output signal of the first magnetic sensor 1 and the output signal of the second magnetic sensor 2 which are amplified by the amplification unit 32 falls outside the predetermined range), the first control signal S3 of the comparison unit 3 and the second control signal S5 of the off-delay timer 5 are set to be at a low level. In this case, in the selection unit 4, the output of the first magnetic sensor 1 having passed through the first magnetic sensor 1 is selected, and is output as the output signal Sout. That is, in a case where the output of the second magnetic sensor 2 starts to be distorted due to the influence of magnetic saturation or the like, the output of the first magnetic sensor 1 is selected in the selection unit 4.

In addition, in a case where the first current level and the second current level are not temporarily coincident with each other within the predetermined range, the first control signal S3 of the comparison unit 3 returns to a high level immediately after being temporarily set to be at a low level, but the second control signal S5 of the off-delay timer 5 remains at a low level for a certain period of time even after the first control signal S3 has returned to a low level. In this case, in the selection unit 4, the output of the first magnetic sensor 1 continues to be selected for a certain period of time, and then is switched to the output of the second magnetic sensor 2. For this reason, an error component remaining in the output of the second low-pass filter 12 for a while even after the temporary magnetic saturation of the second magnetic sensor 2 is terminated is not likely to be output from the selection unit 4.

As described above, according to the current sensor module of the present embodiment, the output of the first magnetic sensor 1 and the output of the second magnetic sensor 2 are provided with the low-pass filters (11 and 12), respectively, and thus it is possible to suppress a fluctuation in measurement results due to the influence noise having a high frequency. Since the frequency of the output signal of the low-pass filters (11 and 12) becomes lower, it is possible to obtain the digital value of the high-accuracy current I to be measured using a relatively low-speed A/D converter.

In addition, according to the current sensor module of the present embodiment, in a case where the current levels (first current level and second current level) indicated by the outputs of the first magnetic sensor 1 and the second magnetic sensor 2 are not coincident with each other within the predetermined range, the output of the first magnetic sensor 1 is immediately selected in the selection unit 4. Thereby, in a case where the current I to be measured temporarily becomes larger as the magnetic saturation of the second magnetic sensor 2 is generated and the output of the second magnetic sensor 2 is distorted, the output of the first magnetic sensor 1 having a low sensitivity which is not likely to generate magnetic saturation is rapidly selected in the selection unit 4. Therefore, since the signal Sout in which an error is generated due to the influence of the magnetic saturation of the second magnetic sensor 2 is not likely to be output from the selection unit 4, it is possible to improve the accuracy of measurement.

Further, according to the current sensor module of the present embodiment, in a case where the current levels (first current level and second current level) indicated by the first magnetic sensor 1 and the output of the second magnetic sensor 2 are coincident with each other within the predetermined range, and the state continues for a certain period of time, the output of the second magnetic sensor 2 is selected in the selection unit 4. Thereby, until error components remaining in the output of the second low-pass filter 12 are sufficiently reduced even after the temporary magnetic saturation of the second magnetic sensor 2 is terminated, the output of the first magnetic sensor 1 continues to be selected in the selection unit 4. Therefore, it is possible to effectively prevent the accuracy of the output signal Sout caused by the magnetic saturation of the second magnetic sensor 2 from decreasing.

In addition, in the current sensor module according to the present embodiment, once the output of the first magnetic sensor 1 is selected in the selection unit 4, the selection of the selection unit 4 is not switched insofar as a current level at which distortion is not generated in the output of the second magnetic sensor 2 does not continue for a certain period of time or more. Therefore, in a case where the current I to be measured fluctuates due to noise in the vicinity of a current level at which distortion starts to be generated in the output of the second magnetic sensor 2, it is possible to effectively prevent the output of the first magnetic sensor 1 and the output of the second magnetic sensor 2 from being unnecessarily switched in the selection unit 4.

Fourth Embodiment

Next, a fourth embodiment of the present invention will be described.

Figure 8:
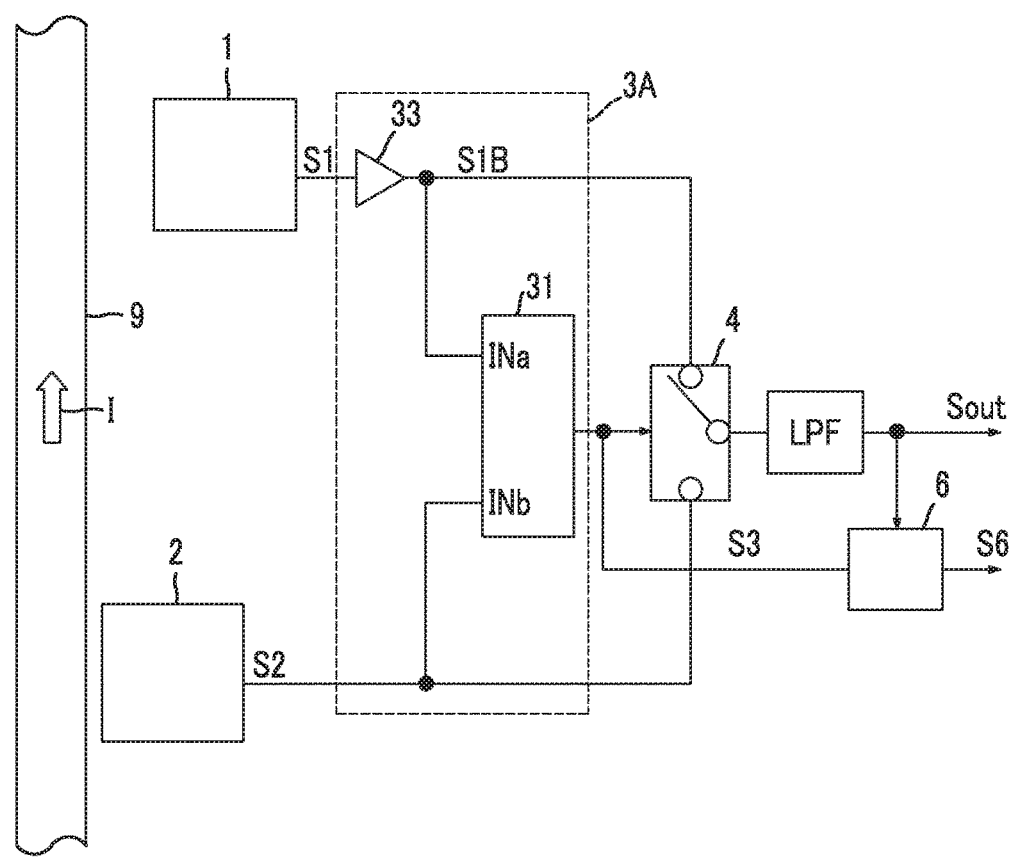
FIG. 8 is a diagram illustrating an example of a configuration of a current sensor according to a fourth embodiment.

FIG. 8 is a diagram illustrating an example of a configuration of a current sensor module according to the fourth embodiment. The current sensor module shown in FIG. 8 includes the first magnetic sensor 1, the second magnetic sensor 2, a comparison unit 3A, the selection unit 4, a third low-pass filter 13, and a failure detection unit 6.

The first magnetic sensor 1 and the second magnetic sensor 2 are the same as the components denoted by the same reference numerals in FIG. 2.

The comparison unit 3A performs the same comparison operation as that of the comparison unit 3 in FIG. 2. As shown in FIG. 8, the comparison unit 3A includes the coincidence determination unit 31 and an amplification unit 33. The coincidence determination unit 31 is the same as the coincidence determination unit 31 of the comparison unit 3 in FIG. 2. The amplification unit 33 is the same as the amplification unit 32 of the comparison unit 3 in FIG. 2, except that the output of the first magnetic sensor 1 is amplified and is input to the selection unit 4.

The selection unit 4 selects any one of the output of the second magnetic sensor 2 or the output of the first magnetic sensor 1 which is amplified by the amplification unit 33, in accordance with the first control signal S3 which is output from the comparison unit 3A.

The third low-pass filter 13 attenuates a high frequency component included in a signal selected in the selection unit 4. The third low-pass filter 13 can be realized by any of an analog circuit and a digital circuit.

The failure detection unit 6 detects the presence or absence of a failure, on the basis of the signal Sout which is output from the selection unit 4 through the third low-pass filter 13 and the first control signal S3 which is output in the comparison unit 3.

Specifically, the failure detection unit 6 determines whether the current I to be measured is smaller than a predetermined threshold current which is smaller than the maximum value of the current I to be measured in a magnetic field capable of being measured in the second magnetic sensor 2, on the basis of the signal Sout which is output from the selection unit 4 through the third low-pass filter 13. In a case where the first control signal S3 (first control signal S3 of a low level in the example of FIG. 4) indicating that the current levels (first current level and second current level) indicated by the outputs of the first magnetic sensor 1 and the second magnetic sensor 2 are not coincident with each other within a predetermined range is output from the comparison unit 3 when the current I to be measured is smaller than the predetermined threshold current, the failure detection unit 6 outputs a signal S6 indicating the detection of a failure.

Figure 9:
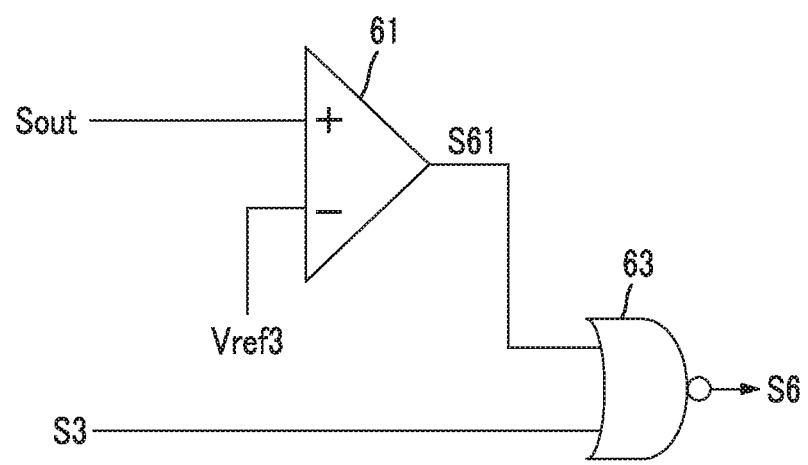
FIG. 9 is a diagram illustrating an example of a configuration of a failure detection unit.

FIG. 9 is a diagram illustrating an example of the failure detection unit 6.

The failure detection unit 6 shown in FIG. 9 includes a comparator 61 and a logic gate 63.

The comparator 61 compares the output signal Sout of the third low-pass filter 13 with a third threshold Vref3, outputs a signal S61 of a high level in a case where the output signal Sout is higher than the third threshold Vref3, and outputs the signal S61 of a low level in a case where the output signal Sout is lower than the third threshold Vref3. The third threshold Verf is equivalent to the level of the output signal Sout in a case where the current I to be measured flows which is equal to the above-described predetermined threshold current.

The logic gate 63 arithmetically operates a negative logical sum of the output signal S61 of the comparator 61 and the first control signal S3 of the comparison unit 3, and outputs the arithmetic operation result as the signal S6.

In a case where the output signal Sout is higher than the third threshold Vref3 (in a case where the current I to be measured is larger than the predetermined threshold current), the output signal S61 of the comparator 61 is set to be at a high level, and thus the signal S6 of a low level is output from the logic gate 63. In addition, in a case where the first control signal S3 of the comparison unit 3 is at a high level (in a case where the first current level indicated by the output of the first magnetic sensor 1 and the second current level indicated by the output of the second magnetic sensor 2 are coincident with each other within a predetermined range), the signal S6 of a low level is also output from the logic gate 63.

On the other hand, in a case where the output signal Sout is smaller than the third threshold Vref3 (the current I to be measured is smaller than the predetermined threshold current), and the first control signal S3 of the comparison unit 3 is at a low level (in a case where the first current level indicated by the output of the first magnetic sensor 1 and the second current level indicated by the output of the second magnetic sensor 2 are not coincident with each other within the predetermined range), the signal S6 of a high level is output from the logic gate 63.

In a case where the current I to be measured is smaller than the predetermined threshold current, magnetic saturation is not generated in the second magnetic sensor 2. Therefore, when the magnetic sensor or the like normally operates, the first current level indicated by the output of the first magnetic sensor 1 and the second current level indicated by the output of the second magnetic sensor 2 become substantially equal to each other. That is, the output signal S2 of the second magnetic sensor 2 and an output signal S1B of the first magnetic sensor 1 which is amplified by the amplification unit 33 become substantially equal to each other. In this case, the first control signal S3 which is output from the coincidence determination unit 31 is set to be at a high level, and the signal S6 of a low level is output from the logic gate 63. The fact that the signal S6 of a high level is output from the logic gate 63 indicates that the magnetic sensor or the like does not normally operate, that is, some kind of failure is present.

As described above, in the current sensor module according to the present embodiment, the output S1 of the first magnetic sensor 1 is amplified in the amplification unit 33 and is input to the selection unit 4, and the ratios of signals which are output from the selection unit 4 to the current I to be measured are the same as each other even in a case where either output of the two magnetic sensors (1 and 2) is selected in the selection unit 4. Therefore, in a case where the signal Sout is converted to the current value of the current I to be measured in a subsequent-stage circuit which is not shown, it is not necessary to switch the rate of conversion in accordance with the selection state of the selection unit 4, and a process can be simplified.

In addition, according to the current sensor module of the present embodiment, the subsequent stage of the selection unit 4 is provided with the third low-pass filter 13. Therefore, it is possible to suppress a fluctuation in measurement results due to the influence of noise having a high frequency, and to obtain the digital value of the high-accuracy current I to be measured using a relatively low-speed A/D converter.

Further, according to the current sensor module of the present embodiment, it is possible to detect the presence or absence of a failure in the magnetic sensor or the like, on the basis of the signal Sout which is output from the selection unit 4 through the third low-pass filter 13 and the first control signal S3 indicating the comparison result of the comparison unit 3. Thereby, since an external device or the like which is not shown can be notified of the abnormality of the measurement value of the current I to be measured, it is possible to improve the reliability of a measurement system.

The present invention is not limited to the above-described embodiments.

That is, those skilled in the art may variously change, combine, sub-combine, and substitute the components of the aforementioned embodiment within the technical scope of the present invention or its equivalents.

For example, in each of the embodiments described above, the first magnetic sensor 1 or the second magnetic sensor 2 may have an amplifier built-in. Particularly, the second magnetic sensor 2 has an amplifier built-in, and thus it is possible to improve the sensitivity of measurement of a minute current.

The current sensor module of the present invention may be configured such that all the portions relating to processing of a signal from the magnetic sensor are realized by an analog circuit, and at least a portion thereof is realized by a digital circuit.

Figure 10:
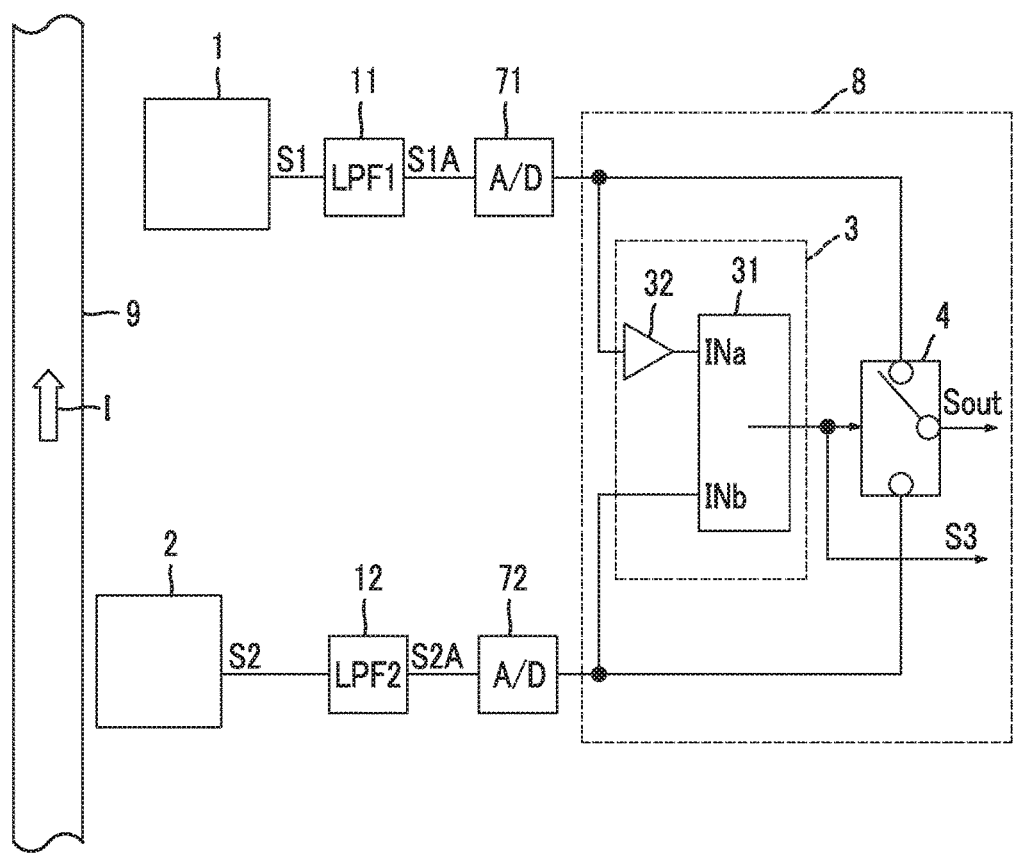
FIG. 10 is a diagram illustrating an example of a current sensor in which a portion of a signal processing system is replaced by a digital circuit.

FIG. 10 is a diagram illustrating an example of a current sensor module in which a portion of a signal processing system is replaced by a digital circuit. The current sensor module shown in FIG. 10 is configured such that the comparison unit 3 and the selection unit 4 in the current sensor module shown in FIG. 5 are constituted by a digital signal processing circuit 8, and includes a first A/D conversion circuit 71 that converts an output signal S1A of the first low-pass filter 11 into a digital signal and a second A/D conversion circuit 72 that converts an output signal S1B of the second low-pass filter 12 into a digital signal. The digital signal processing circuit 8 includes one or more integrated circuits by which a dedicated logic circuit or a CPU is constituted.

As in current sensor module shown in FIG. 10, A/D conversion is performed in the outputs of the low-pass filters (11 and 12), and thus it is possible to use a high-accuracy A/D conversion circuit at a relatively low speed. Meanwhile, in a case where the frequency of the current I to be measured is relatively low, and the mixing of noise is small, A/D conversion may be performed in the outputs of the magnetic sensors (1 and 2), and other signal processing including low-pass filter processing may be digitized.

In the above-described embodiment, the comparison unit includes the coincidence determination circuit 31 (FIG. 4) that performs the determination of whether a difference between two input signals is included in a predetermined range, but the present invention is not limited to this example. In another embodiment of the present invention, the comparison unit may include, for example, an arithmetic operation circuit (such as a division circuit) that generates a signal based on a ratio between two input signals and a determination circuit (such as a window comparator) that determines whether the output signal of the arithmetic operation circuit is included in a predetermined range. In a case where the comparison unit that determines such a ratio between two input signals is provided, the range of determination in the determination circuit is appropriately set, and thus it is also possible to omit the amplification unit that amplifies the output of the first magnetic sensor 1.

In the failure detection unit 6 of the current sensor module shown in FIG. 8, the determination of whether the current I to be measured is smaller than the predetermined threshold current is performed on the basis of the output signal of the selection unit 4, the present invention is not limited to this example. In another embodiment of the present invention, as shown in FIGS. 11A to 11C, the determination may be performed on the basis of signals from the magnetic sensor which have passed through various paths.

Figure 11A:
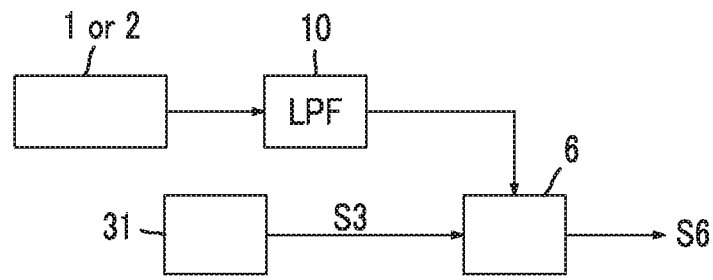
FIGS. 11A to 11C are diagrams illustrating examples of a signal of a magnetic sensor which is input to the failure detection unit.

FIG. 11A shows an example in which a signal from the magnetic sensor (first magnetic sensor 1 or second magnetic sensor 2) which has passed through the low-pass filter 10 is input to the failure detection unit 6.

Figure 11B:
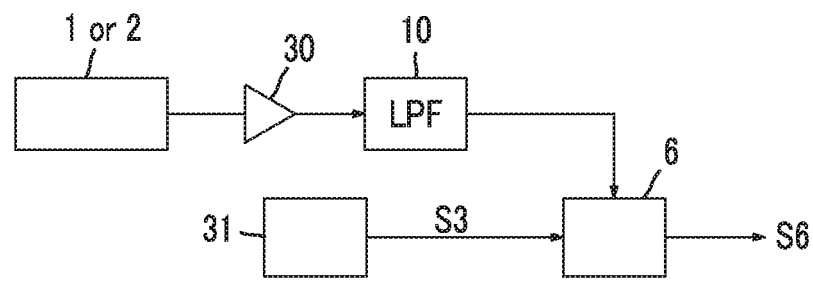

FIG. 11B shows an example in which a signal from the magnetic sensor which has passed through the low-pass filter 10 after amplification by the amplification unit 30 is input to the failure detection unit 6.

Figure 11C:
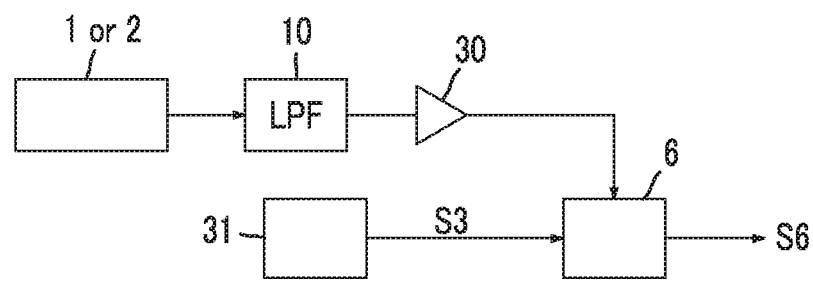
Figure 12:
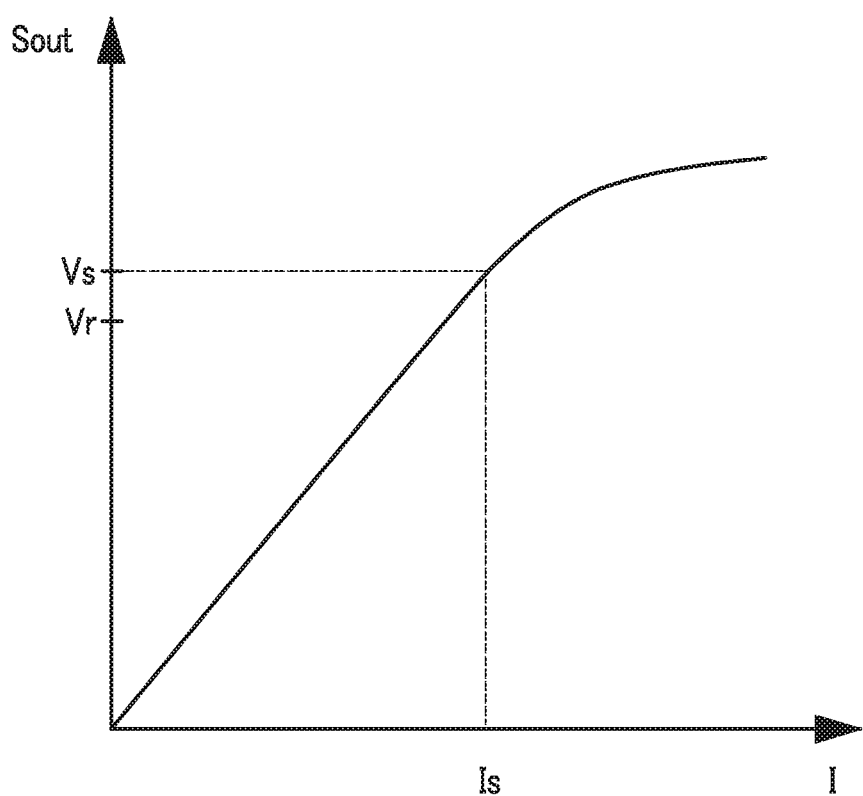
FIG. 12 is a diagram illustrating the characteristics of a magnetic current sensor.

FIG. 11C shows an example in which a signal from the magnetic sensor amplified by the amplification unit 30 after having passed through the low-pass filter 10 is input to the failure detection unit 6.

Figure 6:
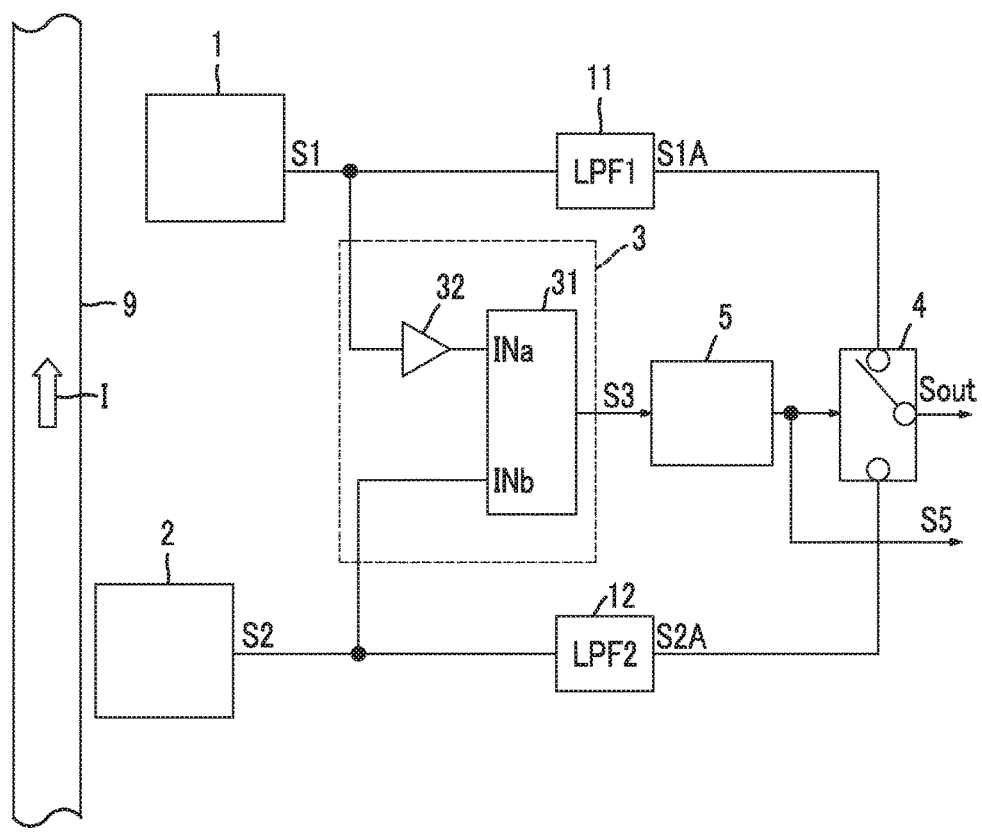
FIG. 6 is a diagram illustrating an example of a configuration of a current sensor according to a third embodiment.

Meanwhile, the low-pass filter 10 shown in FIGS. 11A to 11C may be the first low-pass filter 11 or the second low-pass filter 12 shown in FIGS. 5, 6, and 10, and may be a filter provided separately from these low-pass filters.

In addition, the amplification unit 30 shown in FIGS. 11B and 11C may be the amplification unit 32 shown in FIGS. 2, 5, and 6 or the amplification unit 33 shown in FIG. 8, and may be an amplification unit provided separately from these amplification units.

In the example of FIGS. 11A to 11C, an example is shown in which the signal from the magnetic sensor (first magnetic sensor 1 or second magnetic sensor 2) passes through the low-pass filter 10 and then is input to the failure detection unit 6, but the present invention is not limited thereto. The determination of the current I to be measured by the failure detection unit 6 prevents erroneous determination due to noise from being performed, and thus is preferably performed on the basis of the signal having passed through the low-pass filter. However, in a case where the influence of noise can be ignored, the determination may be performed on the basis of the signal from the magnetic sensor which does not pass through the low-pass filter.

The failure detection unit 6 in the current sensor module shown in FIG. 8 can also be provided in the current sensor module shown in FIGS. 2, 5, and 6. In this case, the detection of a failure in the failure detection unit 6 may be performed on the basis of the signals from the magnetic sensors (1 and 2) and the first control signal S3 which is output from the comparison unit 3.

Likewise, in the current sensor module shown in FIGS. 4, 5, 7, and 9, the first magnetic sensor 1 and the second magnetic sensor 2 are just replaced by sensors capable of measuring a separate physical quantity, thereby allowing sensors that check a separate physical quantity to be used. The operations thereof are true of a case where a current is measured and a case where other physical quantities are measured.

The present invention can be applied to various sensor modules. The present invention can also be applied to an in-vehicle current sensor module requiring a wide dynamic range.

It should be understood by those skilled in the art that various modifications, combinations, sub-combinations and alterations may occur depending on design requirements and other factors insofar as they are within the scope of the appended claims of the equivalents thereof.

What is claimed is:

1. A sensor module comprising:
   a first sensor configured to measure a physical quantity and generate a first output, the first sensor having a first maximum value defining a first range that the first sensor is capable of measuring the physical quantity, and a first sensitivity for measuring the physical quantity;
   a second sensor configured to measure the physical quantity and generate a second output, the second sensor having a second maximum value defining a second range that the second sensor is capable of measuring the physical quantity, and a second sensitivity for measuring the physical quantity, the second maximum value being smaller than the first maximum value and the second sensitivity being higher than the first sensitivity;
   a selection circuit configured to select one of the first output and the second output; and
   a comparison circuit configured to compare a first measurement result indicated by the first output with a second measurement result indicated by the second output,
   wherein the comparison circuit outputs a first control signal that causes the selection circuit to select the second output if the second measurement result matches the first measurement result within a predetermined range, and that causes the selection circuit to select the first output if the second measurement result does not match the first measurement result within the predetermined range, thereby extending a dynamic range of the measurement of the physical quantity.

2. The sensor module according to claim 1,
   wherein the first sensor is a first magnetic sensor configured to measure magnetism which is generated by a current to be measured, the first output indicating a first current level corresponding to the magnetism measured by the first magnetic sensor,
   and wherein the second sensor is a second magnetic sensor configured to measure the magnetism generated by the current to be measured, the second output indicating a second current level corresponding to the magnetism measured by the second magnetic sensor.

3. The sensor module according to claim 1,
   wherein the comparison circuit outputs the first control signal for causing the selection circuit to select the second output if a difference or a ratio between the first measurement result and the second measurement result is within the predetermined range, and outputs the first control signal for causing the selection circuit to select the first output if the difference or the ratio falls outside the predetermined range.

4. The sensor module according to claim 3, further comprising:
   a first low-pass filter for the first output to be selected by the selection circuit; and
   a second low-pass filter for the second output to be selected by the selection circuit,
   wherein the comparison circuit compares the first measurement result indicated by the first output which has passed through the first low-pass filter with the second measurement result indicated by the second output which has passed through the second low-pass filter.

5. The sensor module according to claim 3 further comprising:
   a first low-pass filter for the first output to be selected by the selection circuit; and
   a second low-pass filter for the second output to be selected by the selection circuit;
   wherein the comparison circuit compares the first measurement result indicated by the first output before passing through the first low-pass filter with the second measurement result indicated by the second output before passing through the second low-pass filter,
   and wherein the sensor module further comprises:
      an off-delay timer configured to output a second control signal to the selection circuit in response to the first control signal, the off-delay timer immediately outputting the second control signal for causing the selection circuit to select the first output if the first control signal indicates that the difference or the ratio between the first measurement result and the second measurement result falls outside the predetermined range, and outputting the second control signal for causing the selection circuit to select the second output if the first control signal continues indicating that the difference or the ratio between the first measurement result and the second measurement result falls within the predetermined range for a certain period of time.

6. The sensor module according to claim 3, further comprising:
   a failure detection circuit configured to determine, based on the first output, the second output, or an output signal from the selection circuit, whether the physical quantity is smaller than a predetermined threshold which is smaller than the second maximum value, and to output a failure detection signal if the first control signal indicates that the difference or the ratio between the first measurement result and the second measurement result falls outside the predetermined range when the physical quantity is smaller than the threshold.

7. The sensor module according to claim 3,
   wherein the comparison circuit includes:
      an amplification circuit configured to amplify the first output signal so as to output a first amplified signal; and
      a coincidence determination circuit configured to determine whether a difference between the first amplified signal and the second output signal is within the predetermined range,
   and wherein the amplification circuit has an amplification factor which is set such that the first amplified signal and the second output signal are the same if the physical quantity to be measured is smaller than the second maximum value.

8. The sensor module according to claim 7,
   wherein the amplification circuit amplifies the first output signal to be input to the selection circuit.

9. The sensor module according to claim 7, further comprising:
   a first analog-digital conversion circuit configured to convert the first output signal into a first digital signal;
   a second analog-digital conversion circuit configured to convert the second output signal into a second digital signal; and
   a digital signal processing circuit configured to receive the first digital signal and the second digital signal, the digital signal processing circuit including the comparison circuit and the selection circuit.

\* \* \* \* \*